United States Patent

Pincus

[15] 3,685,048

[45] Aug. 15, 1972

[54] SELF-CALIBRATING ANALOG TO DIGITAL CONVERTER WITH PREDETERMINED TRANSFER CHARACTERISTICS

[72] Inventor: Ralph M. Pincus, Paramus, N.J.

[73] Assignee: The Bendix Corporation

[22] Filed: Sept. 30, 1970

[21] Appl. No.: 76,956

[52] U.S. Cl. ......................340/347 AD, 340/347 CC

[51] Int. Cl. ............................................H03k 13/04

[58] Field of Search ..................340/347 CC, 347 AD

[56] References Cited

UNITED STATES PATENTS

| | | | |
|---|---|---|---|
| 3,148,366 | 9/1964 | Schulz | 340/347 CC |
| 2,897,486 | 7/1959 | Alexander et al. | 340/347 AD |

*Primary Examiner*—Thomas A. Robinson
*Attorney*—Anthony F. Cuoco and Plante, Hartz, Smith and Thompson

[57] ABSTRACT

An analog to digital converter having self-calibrating capability throughout its range at every desired point and including means for providing an analog to digital transfer function with variable offset and slope.

8 Claims, 3 Drawing Figures

INVENTOR.
RALPH M. PINCUS
BY [signature]
ATTORNEY

INVENTOR.
RALPH M. PINCUS
BY Anthony J. Cusco
ATTORNEY

SELF-CALIBRATING ANALOG TO DIGITAL CONVERTER WITH PREDETERMINED TRANSFER CHARACTERISTICS

BACKGROUND OF THE INVENTION

1. Field of the Invention

This invention relates to analog to digital (A/D) converters and, more particularly, to self-calibrating A/D converters with predetermined transfer characteristics.

2. Description of the Prior Art

Although apparatus for automatically calibrating A/D converters through digital or analog computers or nulling devices for full scale calibration are known in the art, there has not heretofore been a device for calibrating the converter at any desired point, including full scale, with the accuracy and stability required in modern applications.

SUMMARY OF THE INVENTION

This invention contemplates a self-calibrating A/D converter which uses a ramp voltage for driving a counter to provide a digital output corresponding to an analog input. The digital output is converted to an analog voltage which is used to charge a sample and hold circuit for accurately holding the analog voltage to provide zero offset correction. Another sample and hold circuit is utilized for positive ramp slope control and still another such circuit is used for negative ramp slope control.

One object of this invention is to provide an A/D converter having self-calibrating capability.

Another object of this invention is to provide an A/D converter of the type described having self-calibrating capability throughout its range at every desired point.

Another object of this invention is to calibrate the converter at any desired point, including full scale, by applying various reference inputs and providing appropriate correction at or near the actual point of operation.

Another object of this invention is to provide an analog to digital converter including means for altering the transfer function of the conversion.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE INVENTION

Figure 1:
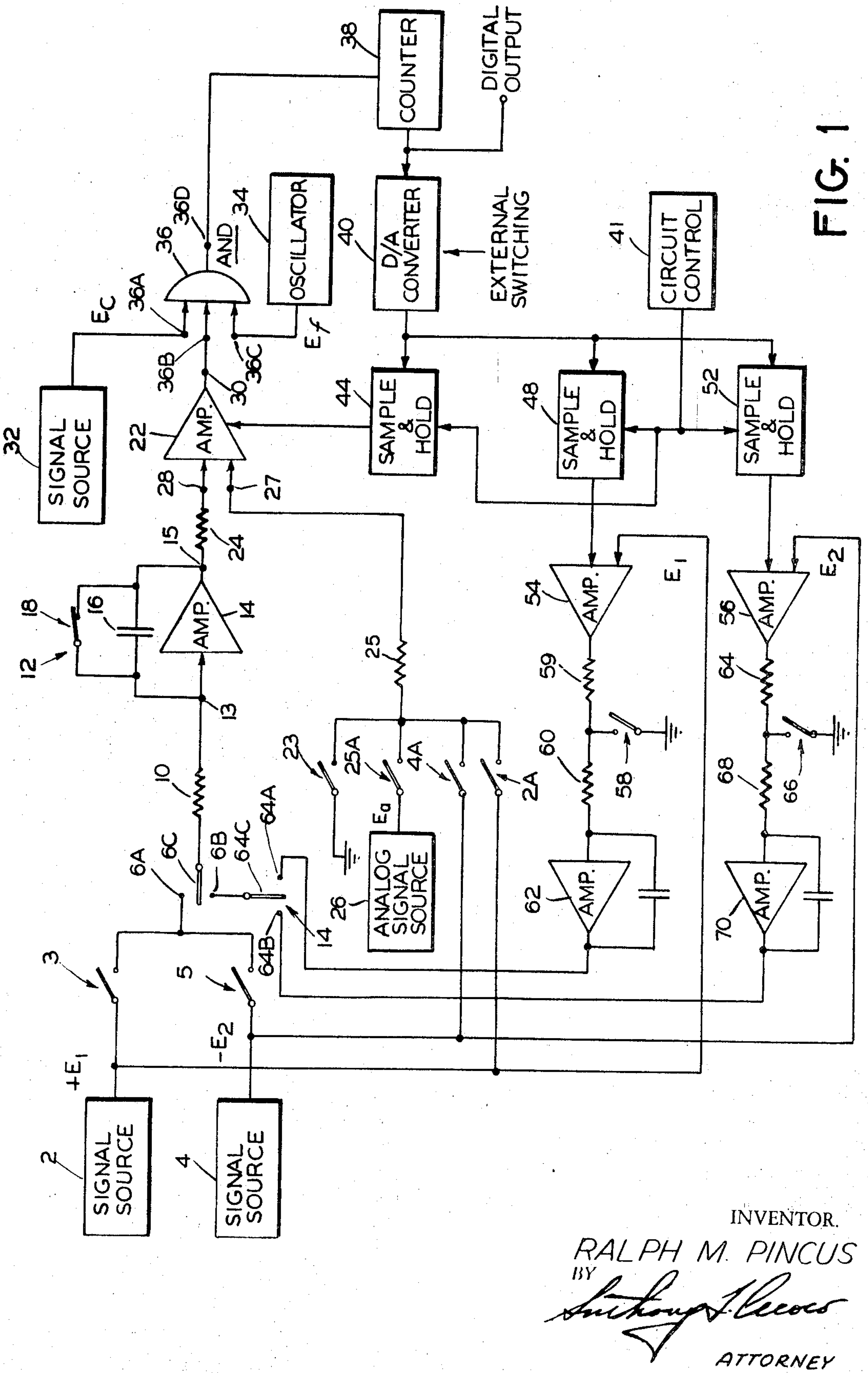
FIG. 1 is a combination block diagram–electrical schematic showing an analog to digital converter including self-calibrating means according to the invention.

With reference to FIG. 1, an analog to digital converter includes a signal source 2 which provides a positive d.c. signal $\mp E_1$ and a signal source 4 which provides a negative d.c. signal $-E_2$. Signal source 2 is connected through a normally open switch 3 to a terminal 6A of a switch 6 having an arm 6C and another terminal 6B. Signal source 4 is connected through a normally open switch 5 to terminal 6A. Arm 6C of switch 6 is connected through a resistor 10 to an integrator 12.

Integrator 12 is of a conventional type such as described at page 356, FIG. 8 –15, *Electronics for Scientists*, Malmstadt, et al., Benjamin, N.Y., and includes an operational amplifier 14 having an input terminal 13 connected to resistor 10 and a capacitor 16 connected in feedback relation to input terminal 13 and to an output terminal 15 of amplifier 14. A normally closed switch 18 is connected across capacitor 16.

A signal source 26 provides an analog signal $E_a$ and it is desired to convert analog signal $E_a$ to a digital signal. Signal source 26 is connected through a resistor 25 and a normally open switch 25A to an input terminal 27 of a comparator amplifier 22 which may be of a conventional type such as described at page 259, *Electronics for Scientists*, supra. Input terminal 27 is connected to ground through resistor 25 and a normally open switch 23, connected to signal source 2 through resistor 25 and a normally open switch 2A and connected to signal source 4 through resistor 25 and a normally open switch 4A. Amplifier 22 has another input terminal 28 connected through a resistor 24 to output terminal 15 of amplifier 14. Amplifier 22 provides an output at an output terminal 30.

A signal source 32 provides a positive and negative going control signal $E_c$ and an oscillator 34 provides pulses $E_f$ at a predetermined frequency. An AND Gate 36 has input terminals 36A, 36B, 36C connected to terminal 30 of amplifier 22, signal source 32 and oscillator 34, respectively. An output terminal 36D of AND Gate 36 is connected to a conventional type digital counter 38. Oscillator 34 may be of the types described at Chapter 5 and counter 38 may be of the type described at page 465, *Electronics for Scientists*, supra.

Thus, when switch 18 is manually or automatically opened, switch arm 6C of switch 6 is manually or automatically actuated to terminal 6A and either switch 3 or switch 5 is closed, depending on whether a positive or negative ramp is desired, integrator 12 integrates either signal $+E_1$ or $-E_2$ to provide a ramp voltage at output terminal 15 of amplifier 14 having a rise or fall rate controlled by the RC constant of the circuit and the level of signal $E_1$ or $E_2$ as the case may be.

Amplifier 22 compares the ramp voltage from integrator 12 with the analog signal from signal source 26 applied to the amplifier by manually or automatically closing switch 25A and provides an amplified signal corresponding to the difference therebetween which controls gate 36. Initially, output signal $E_c$ from signal source 32 is at a low level, gate 36 is open and pulses $E_f$ from oscillator 34 are inhibited from reaching counter 38. When a conversion is to be made control signal $E_c$ goes positive, enabling gate 36. At the same time switch 18 is manually or automatically opened allowing the integrator 12 to initiate its ramp. The comparator (22)

output is initially positive so that when $E_c$ goes positive the "AND" condition is met and counter 38 receives pulses $E_f$.

When comparator 22 reaches coincidence; i.e. when the ramp voltage from integrator 12 and the analog input voltage from signal source 26 are equal, the comparator output at terminal 30 goes to a low voltage level. Gate 36 opens to prevent further transmission of pulses $E_f$ and counter 38 contains a count and provides a digital output corresponding to the interval required for the ramp output to reach input voltage level.

The digital output from counter 38 is applied to a digital to analog converter 40 which may be of the type described at page 456, *Electronics for Scientists*, supra. The output from converter 40 is applied to a sample and hold circuit 44, a sample and hold circuit 48, and a sample and hold circuit 52. Sample and hold circuit 44 is utilized for zero offset correction, sample and hold circuit 48 is used for positive ramp voltage slope control and sample and hold circuit 52 is used for negative ramp voltage slope control. Sample and hold circuits 44, 48 and 52 are sequentially controlled by a control circuit 41 as will be hereinafter described.

In order to accomplish the above noted zero offset correction and ramp voltage slope control, the voltage stored by sample and hold circuit 44 is applied to comparator amplifier 22 and corrects the offset error of the comparator and other offset errors in the converter so that zero analog input equals zero digital output. The voltage stored by sample and hold circuit 48 is compared with reference signal $+E_1$ from signal source 2 by a comparator amplifier 54 for controlling the positive ramp voltage slope and the voltage stored by sample and hold circuit 52 is compared with reference signal $-E_2$ from signal source 4 by a comparator amplifier 56 for controlling the negative ramp voltage slope.

If the outputs from sample and hold circuits 48 and 52 equal the respective reference voltages $+E_1$ and $-E_2$, the outputs from comparators 54 and 56 will be zero. Comparator 54 is connected through series resistors 59 and 60 to a conventional type integrator 62, and a normally open switch 58 is connected intermediate resistors 59, and 60 and is connected to ground. Integrator 62 is connected to a terminal 64A of a switch 64 having another terminal 64B and an arm 64C connected to terminal 6B of switch 6. Comparator 56 is connected through series resistors 64 and 68 to conventional type integrator 70, and a normally open switch 66 is connected intermediate resistors 64 and 68 and is connected to ground. Integrator 70 is connected to terminal 64B of switch 64.

If the output from the comparators is other than zero, indicating an error between the digital output and the reference voltage, the output of the respective integrators 62 and 70 will change to control the slope of the positive and negative going ramp voltages from integrator 12 as will be shown when the operation of the invention is described.

Figures 2, 3:
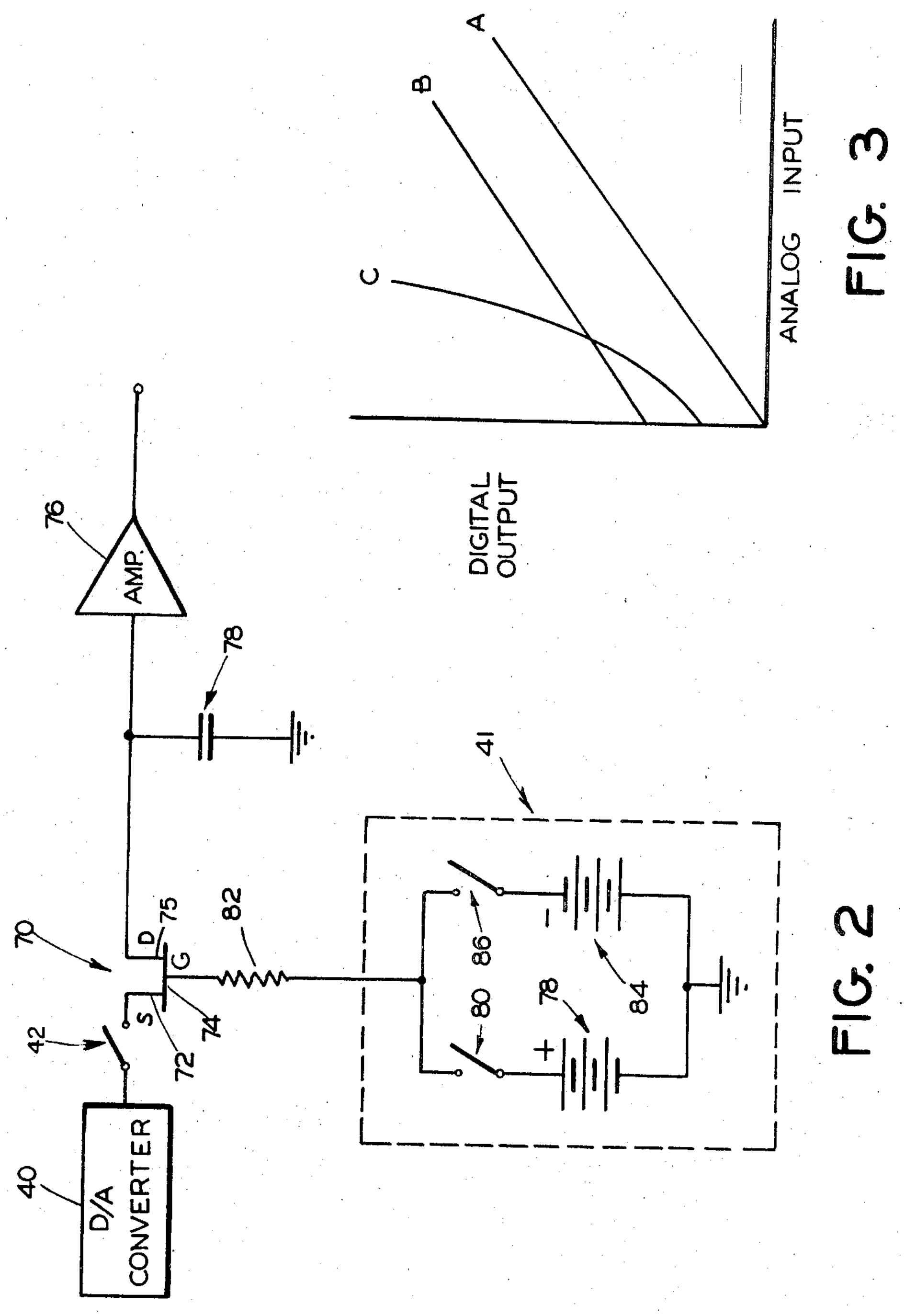
FIG. 2 is an electrical schematic diagram of the sample and hold circuit shown generally in FIG. 1.
FIG. 3 is a graphical representation showing the relation between the analog input and the digital output under various conditions.

Sample and hold circuits 44, 48 and 52 are known in the art and it will suffice to say for purposes of the present invention that such circuits may include a switch that samples an input signal and a hold device for storing the sampled signal. With reference then to FIG. 2, the switch may be a field effect transistor 70 having a source element 72 connected to converter 40 through a switch 42, a gate element 74 connected through a resistor 82 to control circuit 41 and a drain element 75 coupled to a high input impedance buffer amplifier 76 and to a capacitor 78.

Control circuit 41 includes a source of positive direct current shown as a battery 78 connected through a normally open switch 80 and a resistor 82 to gate element 74 and a source of negative direct current shown as a battery 84 connected through a normally open switch 86 and resistor 82 to gate element 74. Transistor 70 is rendered conductive by manually or automatically closing switch 80 whereby the transistor is biased by the positive voltage from battery 78. Transistor 70 is rendered non-conductive by manually or automatically opening switch 80 and closing switch 81 whereby the transistor is biased by the negative voltage from battery 84.

Field effect transistor 70 has the characteristic of very low resistance when conductive and very high resistance when non-conductive. Also amplifier 76 may be selected with characteristics that do not permit capacitor 78 to be discharged through the amplifier resulting in the sample and hold circuit output remaining at the value of the input at the sampling time for a considerable interval. During succeeding samplings the charge stored by capacitor 78 will be updated in accordance with the new sample.

OPERATION

When calibrating according to the invention, switch 23 is first manually or automatically closed to connect the analog input to comparator 22 to ground. Switch 3 is manually or automatically closed and switch arm 6C is likewise actuated to switch terminal 6A to apply or "-sweep" with signal $+E_1$ from signal source 2. The calibration is commenced when switch 18 is opened to allow integrator 12 to sweep and an A/D conversion is made as heretofore explained. The digital output provided by counter 38 represents the converted value which, if in error, will be other than zero.

Converter 40 converts the error output to an analog voltage which is stored by sample and hold circuit 44 for affecting amplifier 22 to compensate for zero offset error. Subsequent like conversions can be made if further compensation is required. All such corrections are made with the analog input to comparator 22 connected to ground.

Upon completion of zero offset calibration, positive ramp voltage slope is calibrated by sweeping with the output of amplifier 62 and utilizing $+E_1$ as the comparator 22 input by closing switch 2A. This is accomplished by manually or automatically displacing switch arm 6C to terminal 6B and switch arm 64C to terminal 64A. The aforenoted A/D and D/A conversions, now with zero offset calibration, are again made and sample and hold circuit 48 will hold the resulting analog voltage corresponding to the $E_1$ input. This voltage is compared with reference signal $E_1$ by comparator amplifier 54 and the amplified error signal is applied to correct the output of integrator 62. Another conversion with a new integrator 12 input voltage provides a closer approximation of the required output from sample and hold circuit 48, and the conversion is repeated until the output from comparator 54 is zero. When this occurs, switch 58 is manually or automatically closed, holding the output of integrator 62 at the correct level for providing the desired slope for the ramp voltage from integrator 12.

In a similar manner, negative ramp voltage slope is calibrated by sweeping with the output of integrator 70 until the output from comparator 56 is zero. This is accomplished by manually or automatically displacing switch arm 64C to terminal 64B while maintaining switch arm 6C at terminal 6B. When the output from comparator 56 is zero, switch 66 is manually or automatically closed to hold the output of integrator 70 at the desired level.

When calibration is complete, the calibrated voltages from integrator 62 and 70 are utilized to control integrator 12. The unknown level of the signal from signal source 26 may now be accurately determined since offset and slope errors have been compensated for.

It will now be understood that a distinct advantage of the present invention over prior art devices is that the converter may be calibrated at any desired point, including full scale, by providing different reference inputs $+E_1$, $-E_2$ and correcting the converter at or near the point of actual operation, and furthermore, this calibration may be achieved automatically.

The device of the invention has another inherent feature in that the transfer function of the A/D conversion can be changed. With reference to FIG. 3, a linear relationship between the analog input and digital output (curve A) is normally desired. Frequently, however, the desired transfer function has an offset or slope other than one to one correspondence (curves B,C).

In order to provide such alternate transfer characteristics, converter 40 may be controlled by external switching (FIG. 1) which provides the offset voltage stored by sample and hold circuits 44, 48, 52 according to a predetermined logic input. Similarly the slope of the positive and negative going ramp voltages from integrator 12 may be adjusted by arranging converter 40 for a particular slope determined by the voltage stored by sample and hold circuits 48 and 52.

Although but a single embodiment of the invention has been illustrated and described in detail, it is to be expressly understood that the invention is not limited thereto. For example, although a ramp type A/D conversion has been used in describing the invention other type A/D conversions may be used as well. Various changes may also be made in the design and arrangement of the parts without departing from the spirit and scope of the invention as the same will now be understood by those skilled in the art.

What is claimed is:

1. Apparatus including an A/D converter and self-calibrating means therefor, comprising:
- a first signal source for providing a reference signal in one sense;
- a second signal source for providing a reference signal in an opposite sense;
- a third signal source for providing an analog signal;
- an A/D converter including an integrator and a comparator connected to the integrator;
- means connected to the comparator for connecting the third signal source to the converter, the comparator being effective for comparing the analog signal and the integrator output and for providing a difference output;
- means for connecting the third signal source to ground;
- means connected to the integrator for selectively connecting one of the first and second signal sources to the A/D converter, with the converter providing a digital output corresponding to the analog signal when the one signal source of the first and second signal sources and the third signal source are connected thereto;
- a D/A converter connected to the A/D converter;
- first calibrating means connected to the D/A converter and responsive to the analog output therefrom for providing a first calibrating output when the third signal source is connected to ground and the one signal source of the first and second signal sources is connected to the A/D converter; and
- means connected to the first calibrating means and to the A/D converter for applying the first calibrating output to the comparator to correct the difference output for zero offset.

2. Apparatus as described by claim 1 including second calibrating means, comprising:
- means connected to the D/A converter and to the first signal source and responsive to the analog output and the first signal for providing a second calibrating output;
- means for disconnecting the first signal source from the integrator in the A/D converter; and
- means for connecting the means for providing a second calibrating output to the integrator in the A/D converter, said second calibrating output affecting said integrator for calibrating the output thereof in the one sense.

3. Apparatus as described by claim 1, including third calibrating means comprising:
- means connected to the D/A converter and to the second signal source and responsive to the analog output and the second signal for providing a third calibrating output;
- means for disconnecting the second signal source from the integrator in the A/D converter; and
- means for connecting the means for providing a third calibrating output to the integrator in the A/D converter, with said third calibrating output affecting said integrator for calibrating the output thereof in the opposite sense.

4. Apparatus as described by claim 1, wherein the first calibrating means includes:
- a sample and hold circuit connected to the D/A converter for sampling the output therefrom and having means for subsequently applying the sampled output to the comparator.

5. Apparatus as described by claim 2, wherein the means for providing a second calibrating output includes:
- a sample and hold circuit connected to the D/A converter for sampling the output therefrom;
- a comparator connected to the sample and hold circuit and to the first signal means for comparing the sampled output and the first signal;
- an integrator connected to the comparator for integrating the output therefrom; and
- a normally open switch connected intermediate the comparator and the integrator, and closed for holding the output of the integrator at a desired level.

6. Apparatus as described by claim 3, wherein the means for providing a third calibrating output includes:

a sample and hold circuit connected to the D/A converter for sampling the output therefrom;

a comparator connected to the sample and hold means and to the second signal means for comparing the sampled output and the second signal;

an integrator connected to the comparator for integrating the output therefrom; and a normally open switch connected intermediate the comparator and the integrator, and closed for holding the output of the integrator at a desired level.

7. Apparatus as described by claim 2, including:

means for connecting the first signal source to the comparator; and said comparator being effective for comparing the integrator signal and the first signal for providing the difference output.

8. Apparatus as described by claim 3, including:

means for connecting the second signal source to the comparator; and said comparator being effective for comparing the integrator signal and the second signal for providing the difference output.

* * * * *